United States Patent
Saito

(10) Patent No.: US 6,589,718 B2
(45) Date of Patent: Jul. 8, 2003

(54) METHOD OF MAKING RESIST PATTERN

(75) Inventor: Hirofumi Saito, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 80 days.

(21) Appl. No.: 09/757,588

(22) Filed: Jan. 11, 2001

(65) Prior Publication Data

US 2001/0008809 A1 Jul. 19, 2001

(30) Foreign Application Priority Data

Jan. 14, 2000 (JP) ........................................ 2000-005581

(51) Int. Cl.[7] ................................................ G03F 7/40
(52) U.S. Cl. ........................ 430/330; 430/311; 430/313; 430/326
(58) Field of Search .................. 430/311, 313, 430/326, 330

(56) References Cited

U.S. PATENT DOCUMENTS

| 5,096,802 A | 3/1992 | Hu | 430/328 |
| 5,284,930 A | * 2/1994 | Matsumoto et al. | 528/482 |
| 5,763,143 A | 6/1998 | Sakura | 430/330 |

FOREIGN PATENT DOCUMENTS

| JP | 53-049954 | 5/1978 |
| JP | 79-24296 | * 8/1979 |
| JP | 2-7413 | 1/1990 |
| JP | 10-274854 | 10/1998 |
| JP | 11-295904 | 10/1999 |
| JP | 2000-12541 | 1/2000 |

OTHER PUBLICATIONS

European Search Report dated Jul. 20, 2001.

* cited by examiner

*Primary Examiner*—Mark F. Huff
*Assistant Examiner*—Nicole Barreca
(74) *Attorney, Agent, or Firm*—McGinn & Gibb, PLLC

(57) ABSTRACT

A method of making a resist pattern is provided, which decreases or eliminates the fluctuation of deformation of original openings of a resist layer which is induced by the change of their density (i.e., the count of the original openings within a unit area) or by their location in the reflowing process. The method comprises the steps of (a) forming a resist layer on a target layer; (b) patterning the resist layer to form original openings and at least one slit in the resist layer; the slit surrounding the original openings and having a specific width; and (c) reflowing the resist layer patterned in the step (b) under heat to cause deformation in the original openings and the at least one slit, thereby contracting the original openings and eliminating the at least one slit; the original openings thus contracted serving as resultant openings for forming desired contact/via holes in the target layer; the resist layer having the resultant openings constituting a resist pattern.

19 Claims, 5 Drawing Sheets

METHOD OF MAKING RESIST PATTERN

BACKGROUND OF THE INVENTION

1. Field of the Invention

The present invention relates to a method of making a resist pattern and more particularly, to a method of making a resist pattern which is applicable to formation of contact holes and/or via holes in a layer or layers of a substrate in semiconductor device fabrication, where the resist pattern (i.e., the patterned resist layer) is used as a mask in the contact/via hole formation process.

2. Description of the Related Art

Semiconductor devices comprise "contact holes" for electrically interconnecting a specific semiconductor or conductive layer with a wiring layer and/or "via holes" for electrically interconnecting an upper wiring layer with a lower wiring layer. In recent years, contact holes and via holes have been becoming smaller according to the increasing integration level.

Typically, contact/via holes are formed by the well-known photolithography and etching techniques. Specifically, after a photo-sensitive resist layer is formed on a dielectric layer, the resist layer thus formed is patterned to have desired openings. The resist layer thus patterned constitutes a "resist pattern" having the openings. Thereafter, using the resist layer thus patterned (i.e., the resist pattern) as a mask, the underlying dielectric layer is selectively etched by way of the openings of the mask, forming contact/via holes in the dielectric layer. Thus, to miniaturize contact/via holes in a desired or target layer, the dimensions of the openings of the resist pattern (i.e., the mask) need to be made smaller according to the desired dimensions of the contact/via holes.

Moreover, since the dimensional error of the contact/via holes (which includes deformation of the contact/via holes themselves) varies dependent on the dimensional error of the openings (which includes deformation of the openings themselves) of the resist pattern, there is the need to form smaller openings in the resist pattern as precisely as possible.

As a result, conventionally, a great deal of effort has been put to decrease the dimensional error of the smaller openings of the resist pattern.

With an example of the prior-art methods to make smaller openings of the resist pattern, after original openings are formed in a resist layer, the resist layer is subjected to a heat treatment at a temperature higher than its softening point, thereby gradually causing plastic deformation in the resist layer. In this method, the dimensions of the original openings are decreased due to the plastic deformation while the shape of the original openings is well controlled. This method is disclosed, for example, in the Japanese Non-Examined Patent Publication Nos. 2-7413 published in 1990, 10-274854 published in October 1998, and 11-295904 published in October 1999.

FIGS. 1A to 1D show the prior-art method of making a resist pattern disclosed in the Japanese Non-Examined Patent Publication No. 11-295904.

First, as shown in FIG. 1A, a positive electron-beam (EB) resist with chemical amplification property (i.e., a positive, chemically amplified resist) is coated on the surface of a substrate 110, forming a resist layer 111 thereon. The target layer (not shown) in which contact/via holes are formed is located at the top of the substrate 110 and thus, it may be said that the layer 111 is located on the target layer.

Using an electron-beam direct writing apparatus, specific openings are formed or written in the resist layer 111. Thus, the layer 111 is selectively exposed to an irradiated electron beam, thereby forming desired exposition areas 111a in the layer 111. Desired original openings are formed in the individual areas 111a.

Next, as shown in FIG. 1B, the resist layer 111 with the exposition areas 111a formed on the substrate 110 is subjected to a post exposure bake (PEB) process and developed, selectively removing the areas 111a from the resist layer 111. Thus, original openings 115 are formed to penetrate the resist layer 111 in the respective areas 111a. The resist layer 111 with the original openings 115 thus formed is termed an original resist pattern 112.

Subsequently, as shown in FIG. 1C, the original resist pattern 112 is subjected to a heat treatment at a specific temperature higher than the softening temperature of the resist layer 111 for reflowing the pattern 112. Through this reflowing process, the original openings 115 are plastically deformed and narrowed, resulting in narrowed or contracted openings 115a, as shown in FIG. 1D. The original resist pattern 112 with the narrowed or contracted openings 115a is termed a resultant resist pattern 113.

With the prior-art method explained with reference to FIGS. 1A to 1D, although the narrowing or contracting effect of the original openings 115 can be generated, there is a problem that unallowable fluctuation of the narrowing/contracting effect for the openings 115 occurs if the density of the openings 115 (i.e., the count of the openings 115 within a unit area) in the original resist pattern 112 varies locally within a wide range. This is due to the correlation of the deformation amount of the openings 115 with their density.

As a result, the resultant openings 115a thus narrowed or contracted tend to have an undesired shape and/or undesired dimensions. In the worst case, some of the original openings 115 disappear (i.e., cease to exist) and accordingly, desired contact/via holes are unable to be formed in the underlying target layer (not shown) of the substrate 110.

The above-described problem can be solved by a measure to change or adjust the dimensions of the original openings 115 in the original resist pattern 112 prior to the reflowing process according to the density distribution of the openings 115 within the pattern 112. This measure can be comparatively easily applied to the memory cells having the periodically-varying density distribution of the openings 115. However, this measure is very difficult to be applied to the logic cells having the randomly-varying density distribution of the openings 115.

The deformation amount of the individual original openings 115 for the logic cells can be predicted with the use of computer simulation or the like. In this case, however, there arises another problem that it takes extremely long time to make a desired resist pattern. Thus, the above-described measure is unable to be applied in practice.

SUMMARY OF THE INVENTION

Accordingly, an object of the present invention is to provide a method of making a resist pattern that decreases or eliminates the fluctuation of deformation of original openings of a resist layer which is induced by the change of their density (i.e., the count of the original openings within a unit area) in the reflowing process.

Another object of the present invention is to provide a method of making a resist pattern that decreases or eliminates the fluctuation of deformation of original openings of a resist layer which is induced by their location or position in the reflowing process.

Still another object of the present invention is to provide a method of making a resist pattern that prevents or effectively suppresses unallowable fluctuation of the narrowing/contracting effect for original openings of a resist layer even if their density varies locally within a wide range.

A further another object of the present invention is to provide a method of making a resist pattern that copes with the miniaturization of resultant openings with a simple measure.

A still further another object of the present invention is to provide a method of making a resist pattern that copes with the miniaturization of resultant openings with a simple measure independent of their density change.

The above objects together with others not specifically mentioned will become clear to those skilled in the art from the following description.

A method of making a resist pattern according to the present invention comprises the steps of:
(a) forming a resist layer on a target layer;
(b) patterning the resist layer to form original openings and at least one slit in the resist layer;
   the slit surrounding at least one of the original openings and having a specific width; and
(c) reflowing the resist layer patterned in the step (b) under heat to cause deformation in the original openings and the at least one slit, thereby contracting the original openings and eliminating the at least one slit;
   the original openings thus contracted serving as resultant openings for forming desired contact/via holes in the target layer;
   the resist layer having the resultant openings constituting a resist pattern.

With the method of making a resist pattern according to the present invention, the resist layer, which is formed on the target layer, is patterned to form the original openings and the at least one slit in the resist layer in the step (b). The at least one slit surrounds the at least one of the original openings and has the specific width.

Thereafter, in the step (c), the resist layer is reflowed under heat to cause deformation in the original openings and the at least one slit, thereby contracting the original openings and eliminating the at least one slit. The original openings thus contracted serves as the resultant openings for forming the desired contact/via holes in the target layer. The resist layer having the resultant openings constitutes the resist pattern.

Accordingly, in the step (c), the at least one slit serves as if it is a breakwater for the softened, reflowing material of the resist layer with the original openings, thereby suppressing undesired, excessive deformation of the same material. Also, the at least one slit is eliminated in the step (c) and therefore, it gives no effect to the subsequent process steps.

When the at least one slit is provided to suppress or prevents the excessive deformation of the material of the resist layer in its peripheral area, the at least one slit is located between an edge of the resist layer and the original openings adjacent to the edge. In this case, relatively larger deformation of the material of the resist layer in the peripheral area with respect to deformation of the same material in the middle or internal area is suppressed effectively by the at least one slit. As a result, the fluctuation of deformation of the original openings of the resist layer which is induced by the positional change of the original openings is decreased or eliminated in the reflowing step (c).

Thus, unallowable fluctuation of the narrowing/contracting effect for the original openings is prevented or effectively suppressed even if some of the original openings exist in or near the peripheral area of the resist layer. This means that the method can cope with the miniaturization of the resultant openings with a simple measure.

On the other hand, when the at least one slit is provided to suppress or prevents the fluctuation of deformation of the material of the resist layer which is induced according to the density difference of the original openings, the at least one slit is located so as to surround the respective sets of the original openings arranged at different densities. Thus, the per-opening volumes of the material of the resist layer for the respective sets of the original openings are controlled to be approximately equal to each other. In this case, the deformation amounts of the material of the resist layer for the respective sets of the original openings are set approximately equal. As a result, the fluctuation of deformation of the original openings of the resist layer which is induced by their density change is decreased or eliminated in the reflowing step (c).

Thus, unallowable fluctuation of the narrowing/contracting effect for the original openings is prevented or effectively suppressed even if the density of the original openings varies locally within a wide range. This means that the method can cope with the miniaturization of the resultant openings with a simple measure independent of their density change.

In a preferred embodiment of the method according to the invention, the at least one slit is located between an edge of the resist layer and the at least one of the original openings adjacent to the edge.

In another preferred embodiment of the method according to the invention, first to n-th sets of the original openings are located at first to n-th densities in first to n-th regions of the resist layer, respectively, where n is an integer greater than unity. At least two of the first to n-th densities are different from each other. The at least one slit is formed to surround each of the first to n-th regions of the resist layer.

In this embodiment, preferably, the at least one slit is formed in such a way that per-opening volumes of a material of the resist layer in the first to n-th regions are approximately equal to each other.

In still another preferred embodiment of the method according to the invention, the at least one slit has a width in such a way as to disappear after the step (c) of reflowing the resist layer is finished.

In a further preferred embodiment of the method according to the invention, the resist layer is made of a positive photoresist material. For example, the material contains a quinone-azide-system photosensitive agent, an alkali-soluble resin, and a solvent.

Preferably, in the step (c) of reflowing the resist layer, the patterned resist layer is reflowed at a temperature higher than a softening temperature of a material of the resist layer by 10° C. or more and not exceeding 150° C. If the patterned resist layer is reflowed at a temperature higher than a softening temperature of a material of the resist layer by less than 10° C., desired deformation does not occur in the resist layer. Thus, the advantages or effects of the invention are not given.

On the other hand, if the patterned resist layer is reflowed at a temperature exceeding 150° C., excessive deformation occurs in the resist layer. Thus, the advantages or effects of the invention are not given.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1A:
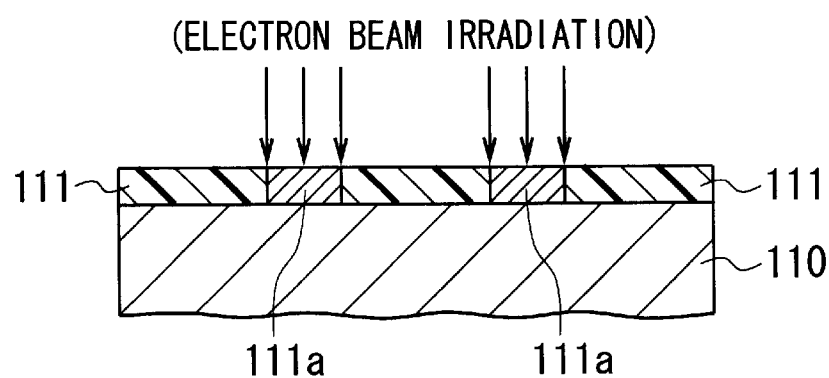
FIGS. 1A to 1D are schematic, partial plan views showing the prior-art method of making a resist pattern with narrowed or contracted openings, respectively.
Figure 1B:
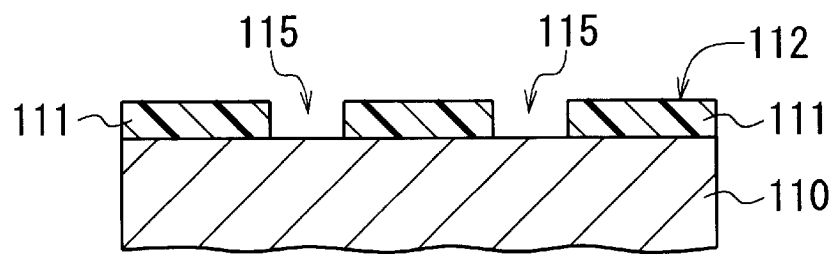
Figure 1C:
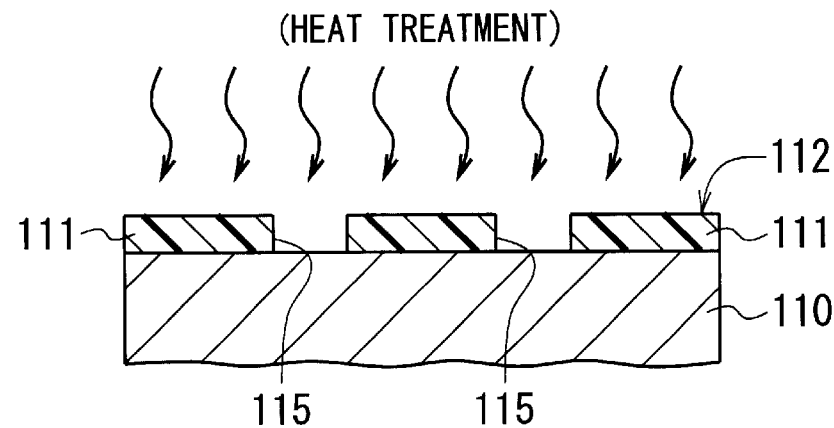
Figure 1D:
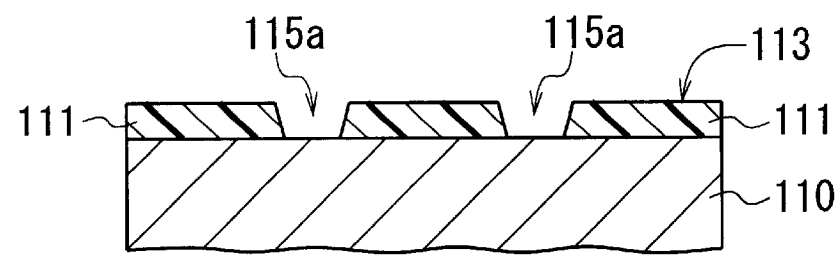

Preferred embodiments of the present invention will be described in detail below while referring to the drawings attached.

First Embodiment

A method of making a resist pattern according to a first embodiment of the invention comprises the steps explained below with reference to FIGS. 2 to 6.

Prior to the start of the method according to the first embodiment, a substrate 1 is provided, which is mainly made of semiconductor. On the substrate 1, desired memory cells or logic cells (not shown) have been formed through a known process sequence. A dielectric target layer 11 is formed at the top of the substrate 1. Desired contact holes and/or via holes are formed in the target layer 11 by using the resist pattern (i.e., mask) to be made through the method according to the first embodiment explained below.

In the method according to the first embodiment, first, a resist material is coated on the surface of the substrate 1 (i.e., on the target layer 11 of the substrate 1). Thus, a resist layer 2 is formed on the surface of the substrate 1.

It is preferred that the resist layer 2 is made of a positive non-chemically-amplified photoresist containing a quinone-azide-system photosensitive material (e.g., known naphtho-quinone azide), an alkali-soluble resin, and a solvent. As the alkali-soluble resin, novolac resin, polyhydroxystyrene or its derivative, styrene-maleic anhydride copolymer, or the like may be used.

The resist layer 2 may be made of any positive chemically-amplified photoresist, which contains, for example, a polyhydroxystyrene resin protected by a tertiary butoxycarbonyl group and a light generator agent. Any other photoresist may be used for the resist layer 2.

Any other resist than these photoresists may be used for the resist layer 2 if it gives some deformation through its reflowing process.

Figure 2:
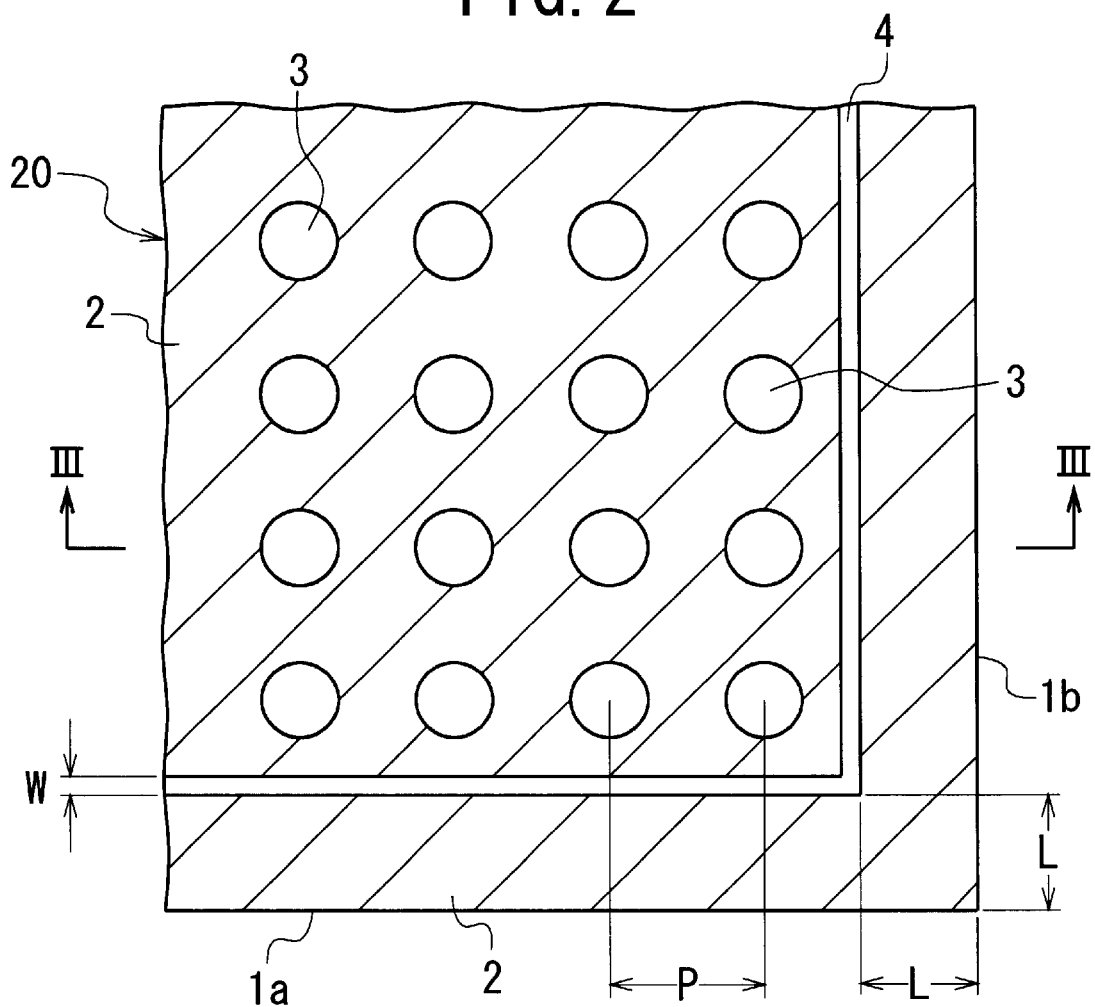
FIG. 2 is a schematic, partial plan view showing the state of the patterned resist layer prior to the reflowing process in a method of making a resist pattern according to a first embodiment of the present invention.
Figure 3:
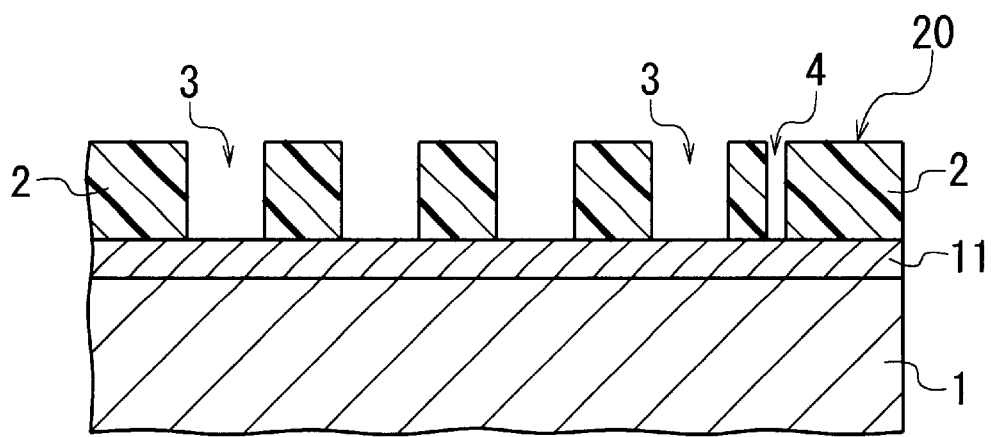
FIG. 3 is a schematic, partial cross-sectional view taken along the line III—III in FIG. 2.

Second, the resist layer 2 is selectively exposed to specific exposing light using a specific mask and then, it is developed with a developer solution to remove selectively the layer 2. Thus, circular original openings 3 and an L-shaped slit 4 are formed in the layer 2, as shown in FIGS. 2 and 3. The openings 3 are regularly arranged in a specific region. The slit 4 is located near the periphery of the substrate 1. The slit 4 have two arms, which extend along the two straight sides of the rectangular region in which the openings 3 are arranged.

As seen from FIGS. 2 and 3, one of the arms of the slit 4, which extends along the linear edge 1a of the substrate 1, is located between the edge 1a and the outermost openings 3 adjacent to the edge 1a. The other arm of the slit 4, which extends along the linear edge 1b of the substrate 1, is located between the edge 1b and the outermost openings 3 adjacent to the edge 1b.

The width W of the slit 4 is determined in such a way that the slit 4 disappears naturally after the reflowing process (which is referred to later) of the resist layer 2 is completed. For example, the width W is set to be near the limit of resolution of the optical exposing apparatus used for the method of the first embodiment.

The length L from the edge 1a or 1b of the substrate 1 to the corresponding arm of the slit 4 is set to be approximately equal to the pitch P of the original openings 3. This is to suppress effectively the relatively larger deformation of the resist material of the resist layer 2 in its peripheral area with respect to the deformation of the same material in its middle or internal area. Thus, the fluctuation of deformation of the original openings 3 of the resist layer 2 which is induced by the positional change of the openings 3 is decreased or eliminated in the subsequent reflowing process.

Moreover, because of the slit 4, the per-opening volumes of the resist material that contributes the reflowing action/effect of the resist layer 2 in the neighborhoods of the respective openings 3 are approximately uniformized or equalized.

Another slit 4 may be additionally formed in the resist layer 2 to surround a region or regions where the density of the original openings 3 is low, as necessary.

As the exposing light, any light used popularly for this purpose may be used. For example, g-line (wavelength: 436 nm), i-line (wavelength: 365 nm), or excimer laser light (KrF, wavelength: 248 nm; ArF, wavelength: 193 nm; $F_2$, wavelength: 157 nm) may be used. Alternately, electron beam or X ray may be used according to the material of the resist layer 2.

As the developer solution, popular tetramethylammonium hydroxide (TMAH) may be used.

The patterned resist layer 2 with the original openings 3 and the slit 4 is termed the "original resist pattern 20".

Subsequent to the optical exposing process described above, the substrate 1 with the original resist pattern 20 is subjected to a heat treatment process at a specific temperature, causing a reflowing action of the resist layer 2 on the substrate 1. The reflowing temperature is set at a temperature equal to or higher than the softening temperature of the resist material of the layer 2.

Figure 4:
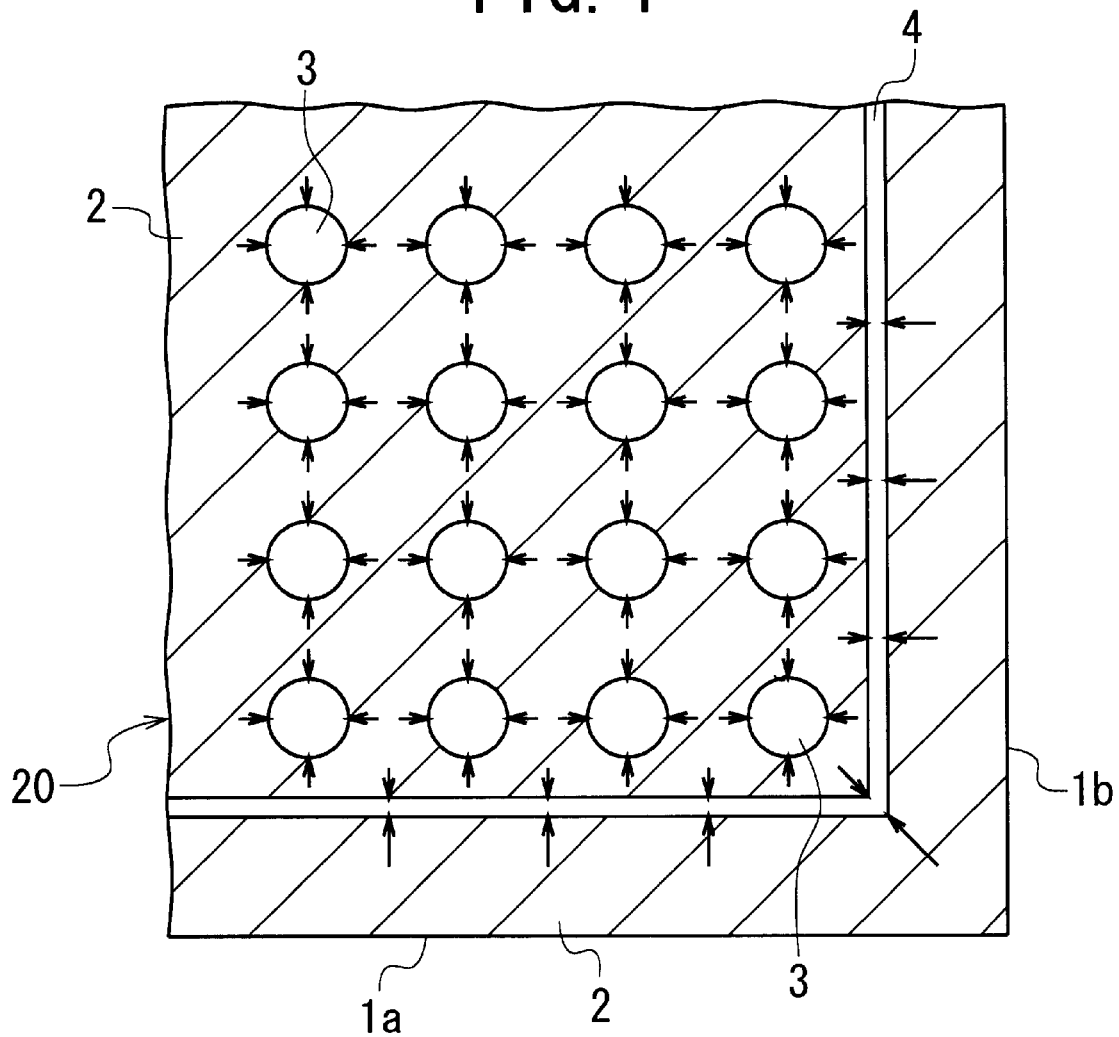
FIG. 4 is a schematic, partial plan view showing the displacement or contraction of the original openings of the patterned resist layer during the reflowing process in the method according to the first embodiment of FIG. 2.

In the reflowing process, the softened resist material reflows along the directions indicated by arrows shown in FIG. 4. In other words, the resist layer 2 causes plastic deformation in such a way that the individual original opening 3 are narrowed or contracted. At this time, the relatively larger flowing action of the resist material in the vicinity of the edges 1a and 1b of the substrate 1 is inhibited by the slit 4. Thus, the reflowing action of the resist material in the neighborhood of the outermost openings 3 located near the edges 1a and 1b is effectively suppressed at approximately the same level as that in the inner area of the substrate 1.

Moreover, as described above, the per-opening volumes of the resist material contributing the reflowing action or effect is approximately uniformized or equalized in each opening 3. Thus, the reflowing action or effect of the resist material around each opening 3 is approximately uniform.

Figure 5:
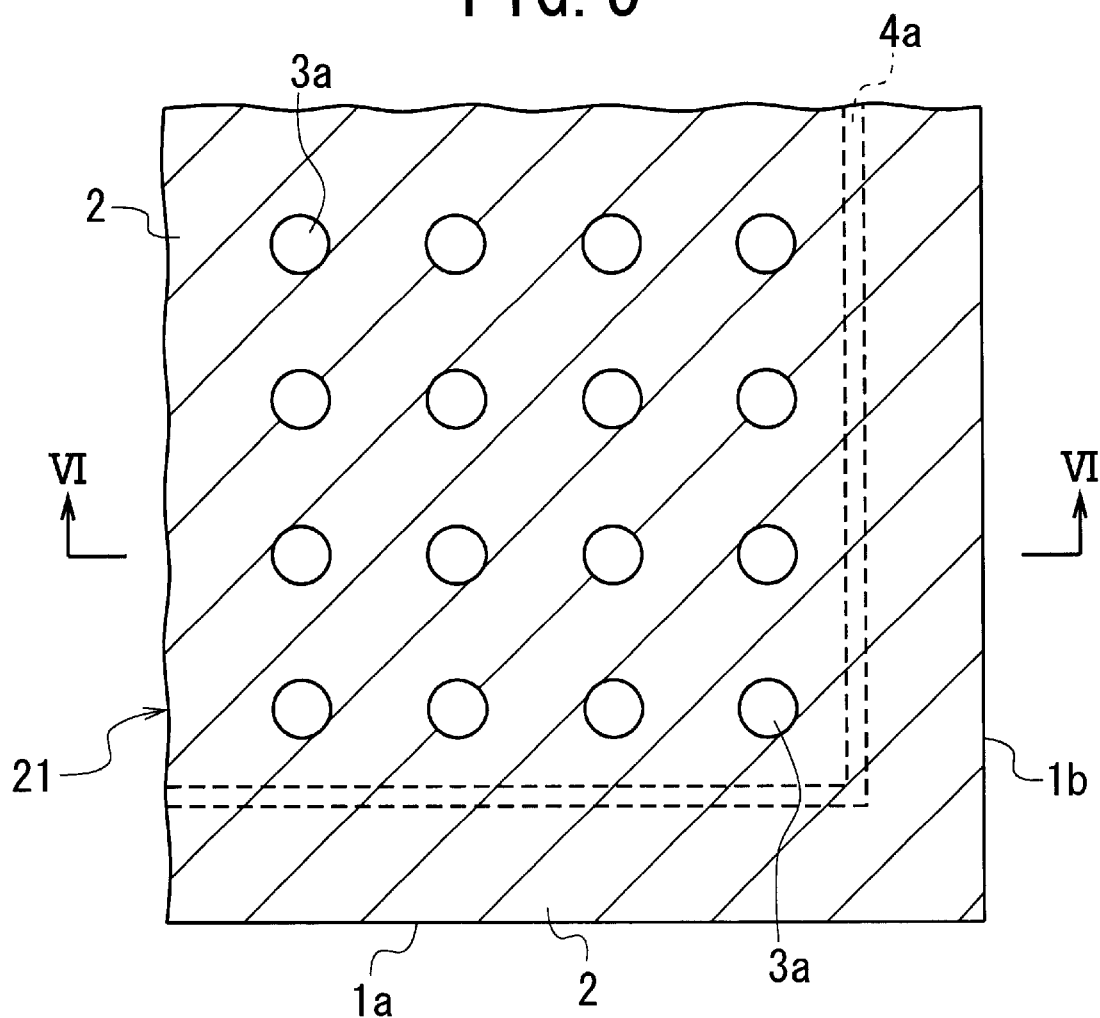
FIG. 5 is a schematic, partial plan view showing the state of the patterned resist layer after the reflowing process in the method according to the first embodiment of FIG. 2.
Figure 6:
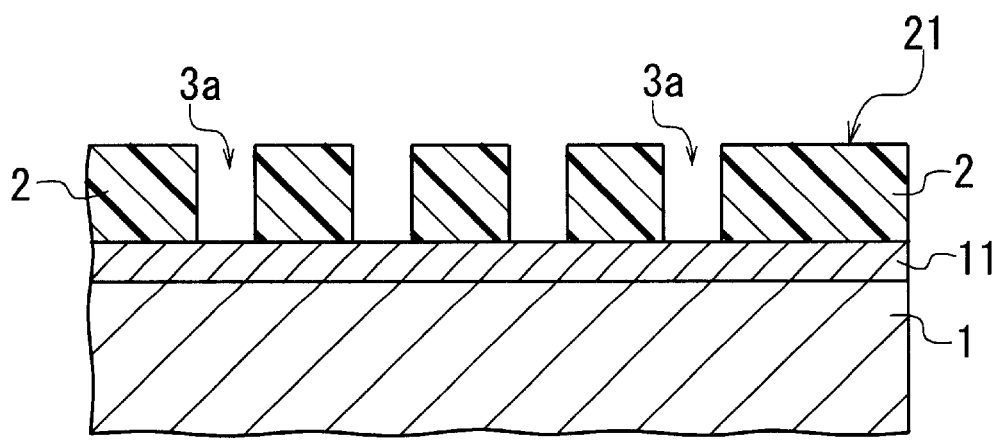
FIG. 6 is a schematic, partial cross-sectional view taken along the line VI—VI in FIG. 5.

Thus, as shown in FIGS. 5 and 6, contracted or diameter-decreased openings 3a are formed in the resist layer 2. The contracted openings 3a thus formed are referred as "resultant openings 3a". The resist layer 2 having the resultant openings 3a is referred as a "resultant resist pattern 21".

Since the reflowing action or effect of the resist material around the individual original openings 3 is approximately uniformized, the fluctuation of deformation of the resultant openings 3a is suppressed. This means that the diameter of the resultant openings 3a is substantially uniform independent of the positional difference of the openings 3a on the resist layer 2.

The width W of the slit 4 is set as sufficient small as possible and therefore, the slit 4 is effectively subjected to the reflowing action of the resist material. As a result, as shown in FIGS. 5 and 6, the slit 4 is filled with the resist material and finally, it is eliminated when the reflowing process is completed. The broken lines in FIG. 5 represent the eliminated slit 4. Thus, the slit 4 does not exist in the resultant resist pattern 21 after the reflowing process and as a result, the slit 4 gives no effect to the subsequent process steps.

Accordingly, unallowable fluctuation of the narrowing/contracting effect for the original openings 3 is prevented or effectively suppressed even if some of the original openings 3 exist in or near the peripheral area of the resist layer 2 (i.e., of the substrate 1). This means that the method according to the first embodiment of the invention can cope with the miniaturization of the resultant openings 3a of the resultant resist pattern 21 with a simple measure.

To confirm the advantages and effects of the above-described method according to the first embodiment, the inventor conducted practically the method in the following way.

First, as shown in FIG. 2, a photoresist material was prepared by dissolving 1,2-naphthoquinonediazide-5-sulfonic acid as a photosensitive agent and a novolac resin (e.g., m-cresol) into methyl methoxypropionate together. The photoresist material thus prepared was coated onto the surface of the substrate 1 by the known spin coating process. The substrate 1 was mainly made of silicon (Si). The material thus coated was subjected to a pre-exposure bake process at 90° C. for one minute. Thus, the resist layer 2 with a thickness of approximately 1 $\mu$m was formed on the surface of the substrate 1.

Next, the photoresist layer 2 thus formed on the substrate 1 was selectively exposed to the i-line using an exposing mask and then, it was subjected to a post exposure bake process at 110° C. for about one minute. Thereafter, the layer 2 was developed by a water solution of 2.5 wt %-tetramethylammonium hydroxide, forming the circular original openings 3 with a diameter of 0.35 $\mu$m and the L-shaped slit 4 with the width of 0.30 $\mu$m in the layer 2.

Following this, the substrate 1 on which the photoresist layer 2 was formed was subjected to a baking process at 120° C. for about two minutes. Then, the photoresist layer 2 was exposed to irradiation of ultraviolet (UV) rays for about three minutes, thereby reflowing the layer 2. In this reflowing process, as shown in FIGS. 5 and 6, the original openings 3 were narrowed or contracted to be the resultant openings 3a with a desired, smaller diameter of 0.30 $\mu$m. At the same time, the slit 4 was filled with the photoresist material of the layer 2 and was eliminated completely due to the reflowing action of the same material.

Through the above-described processes, it was confirmed that the diameter of the original openings 3 was decreased stably and that the slit 4 was eliminated completely.

As a comparative example, the original openings 3 were formed in the same photoresist layer 2 in the same way as explained as above except that the slit 4 was not formed in the layer 2. In this case, almost all the openings 3 were contracted to be the resultant openings 3a with diameters smaller than 0.30 $\mu$m due to the reflowing action. At the same time as this, some of the openings 3 were partially filled with the photoresist material and the remaining openings 3 were completely filled with the same material and eliminated.

As explained above, with the method of making a resist pattern according to the first embodiment, the relatively larger reflowing action of the photoresist layer 2 in the vicinity of the edges 1a and 1b of the substrate 1 is effectively inhibited by the slit 4. Also, the per-opening volume of the photoresist material that contributes to the reflowing action or effect is uniformized in the individual original openings 3. As a result, the fluctuation of deformation of the openings 3 is suppressed effectively, providing approximately uniform dimensions of the resultant openings 3a on the resultant resist pattern 21.

Unlike the prior-art method, the problem that the resultant openings 3a have undesired shape and/or undesired dimensions and that the original openings 3 disappear to result in elimination of contact/via holes is avoided.

Second Embodiment

Figure 7:
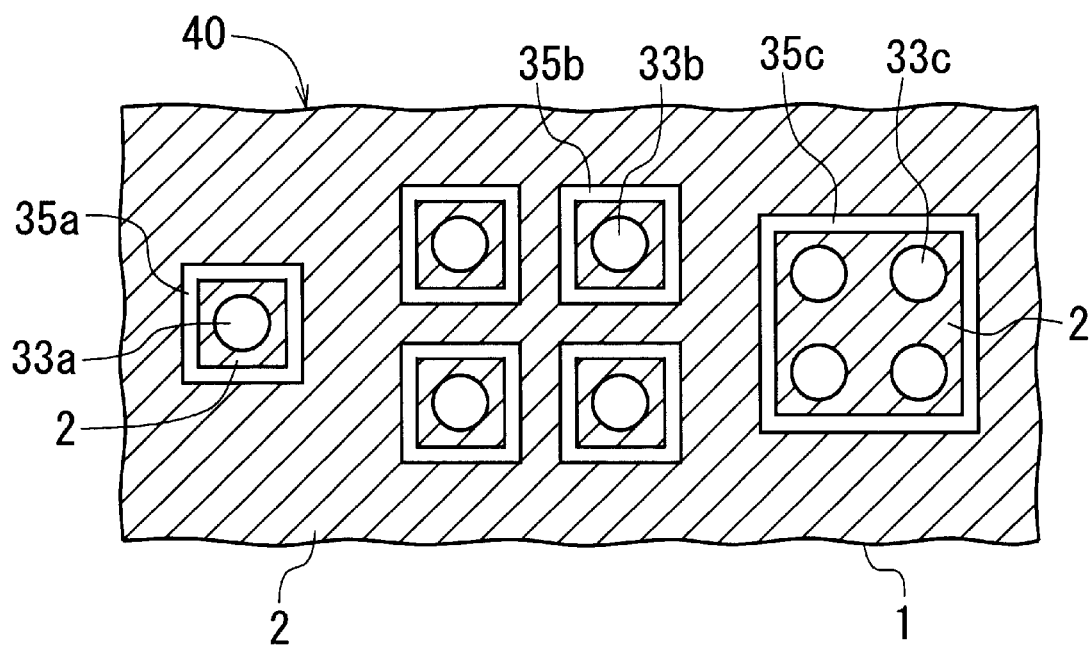
FIG. 7 is a schematic, partial plan view showing the state of the patterned resist layer prior to the reflowing process in a method of making a resist pattern according to a second embodiment of the present invention.
Figure 8:
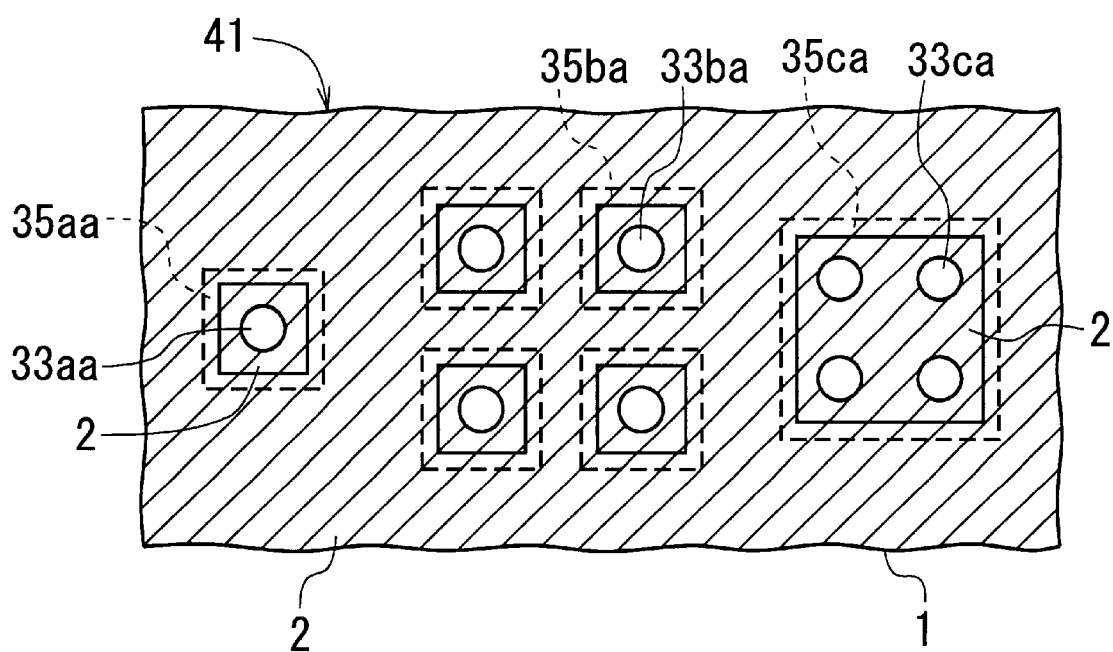
FIG. 8 is a schematic, partial plan view showing the state of the patterned resist layer after the reflowing process in the method according to the second embodiment of FIG. 7.

FIGS. 7 and 8 show a method of making a resist pattern according to a second embodiment of the invention.

In the method according to the first embodiment, the L-shaped slit 4 is formed in the resist layer 2 near the periphery (i.e., the edges 1a and 1b) of the substrate 1 to thereby decrease the fluctuation of deformation of the original openings 3 induced by their positional difference. Unlike this, in the method according to the second embodiment, as shown in FIG. 7, circular original openings 33a, 33b, and 33c are formed in the resist layer 2 and at the same time, rectangular slits 35a, 35b, and 35c are formed in the layer 2 to surround the openings 33a, 33b, and 33c, respectively.

In the original resist pattern 40 shown in FIG. 7, the density of openings in the first region that includes the single opening 33a is located is the lowest. The first region is on the left-hand side of FIG. 7. The density of openings in the third region that includes the four openings 33c are located in the highest, which is on the right-hand side of FIG. 7. The density of openings in the second region that includes the four openings 33b are located is the middle, which is positioned between the left-side, first region of the opening 33a and the right-side, third region of the openings 33c.

To uniformize or equalize the per-opening volumes of the photoresist material of the resist layer 2 that contributes the reflowing action or effect in the first to third regions, the rectangular slits 35a, 35b, and 35c are formed in such a way that the per-opening volumes of the photoresist material in the first to third regions are approximately uniform or equal to each other.

Specifically, for example, in the first region at the left-hand side of FIG. 7, the rectangular slit 35a is formed to surround the single openings 33a. In the third region at the right-hand side of FIG. 7, the rectangular slit 35c is formed to surround the four openings 33c. In the second region at the middle of the first and third regions, the four rectangular slits 35b are formed to surround the four openings 33b, respectively. In other words, each of the slits 35b surrounds a corresponding one of the openings 33b. Thus, the per-opening volumes of the photoresist material contributing the reflowing action or effect in the first to third regions can be approximately or completely equal to each other.

Concretely, here it is supposed that the resist layer 2 is 1 $\mu$m in thickness, the right-sided original openings 33c surrounded by the slit 35c are 0.35 $\mu$m in diameter, the interval between the adjoining openings 33c is 1 $\mu$m, and the distance between each opening 33c and the slit 35c is 0.30 $\mu$m. Also, it is supposed that the original opening 33a located at the left side and the original openings 33b located at the middle have equal diameters of 0.35 $\mu$m. In this case, preferably, the slit 35a is formed to surround the opening 33a at a distance of 0.40 $\mu$m from the opening 33a while the slits 35b are formed to surround the respective openings 33b at a distance of 0.40 $\mu$m from the corresponding one of the openings 33b, respectively. If so, all the per-opening volumes of the photoresist material of the resist layer 2 existing in the respective slits 35a, 35b, and 35c are equal to 1.22 $\mu$m$^3$.

Thus, even if the original openings 33a, 33b, and 33c are narrowed or contracted due to the reflowing action, the fluctuation of deformation of the photoresist material due to the density difference of the openings can be decreased or eliminated. As a result, as shown in FIG. 8, contracted openings 33aa, 33ba, and 33ca having approximately equal shapes and dimensions are formed in the resist layer 2.

The contracted openings 33aa, 33ba, and 33ca thus formed are referred as "resultant openings". The resist layer 2 having the resultant openings 33aa, 33ba, and 33ca is referred as a "resultant resist pattern 41".

Since all the slits 35a, 35b, and 35c disappear completely after the reflowing process is finished, they give no effects to the subsequent process steps.

In FIG. 8, the reference symbols 35aa, 35ba, and 35ca indicated by the broken lines represent the slits that have been disappeared due to the reflowing action.

To confirm the advantages and effects of the above-described method according to the second embodiment, the inventor conducted practically the method in the same way as the first embodiment.

Specifically, first, as shown in FIG. 7, a photoresist material was prepared in the same way as the first embodiment, forming the resist layer 2 with a thickness of approximately 1 $\mu$m on the substrate 1.

Next, the photoresist layer 2 on the substrate 1 was selectively exposed to the i-line, and subjected to a post exposure bake process, and developed in the same way as the first embodiment, forming the circular original openings 33a, 33b, and 33c with equal diameters of 0.35 $\mu$m and the rectangular slits 35a, 35b, and 35c with equal widths of 0.30 $\mu$m in the layer 2.

The substrate 1 on which the photoresist layer 2 had been formed was subjected to a baking process, and exposed to irradiation of UV rays in the same way as the first embodiment, thereby reflowing the layer 2. In this reflowing process, as shown in FIG. 8, the original openings 33a, 33b, and 33c were contracted to be the resultant openings 33aa, 33ba, and 33ca with desired, smaller diameters of 0.25 $\mu$m, 0.28 $\mu$m, and 0.30 $\mu$m, respectively. At the same time, the slits 35a, 35b, and 35c were eliminated completely due to the reflowing action of the layer 2.

Through the above-described processes, it was confirmed that the diameter of the original openings 33a, 33b, and 33c was decreased stably while the slits 35a, 35b, and 35c disappeared completely.

As a comparative example, the original openings 33a, 33b, and 33c were formed in the photoresist layer 2 in the same way as explained as above except that the slits 35a, 35b, and 35c were not formed in the layer 2. In this case, a considerable part of the openings 33a, 33b, and 33c were completely filled with the photoresist material and they were eliminated.

As explained above, with the method of forming a patterned resist layer according to the second embodiment, the per-opening volumes of the photoresist material of the resist layer 2 for the original openings 33a, 33b, and 33c are controlled to be approximately equal to each other. Therefore, the deformation amounts of the photoresist material for the original openings 33a, 33b, and 33c are approximately equal to each other. Thus, the fluctuation of deformation of the openings 33a, 33b, and 33c which is induced by their density change is decreased or eliminated in the reflowing process. This means that the resultant openings 33aa, 33ba, and 33ca have uniform shape and dimensions.

Consequently, unallowable fluctuation of the narrowing/contracting effect for the original openings 33a, 33b, and 33c is prevented or effectively suppressed even if the density of the original openings 33a, 33b, and 33c varies locally within a wide range. This means that the method of the second embodiment can cope with the miniaturization of the resultant openings 33aa, 33ba, and 33ca with a simple measure independent of their density change.

In the above-described first and second embodiments, the openings are circular and the slits are rectangular. However, the invention is not limited to these cases. It is needless to say that the openings and the slits may have any other shape according to the necessity.

Furthermore, although the substrate 1 is mainly made of Si in the first and second embodiments, it may be made of any other material.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of making a resist pattern, comprising:
    forming a resist layer on a target layer;
    patterning the resist layer to form original openings and at least one slit in the resist layer, the slit surrounding at least one of the original openings and having a specific width; and
    reflowing the patterned resist layer under heat to cause deformation in the original openings and the at least one slit, thereby contracting the original openings and eliminating the at least one slit, the original openings thus contracted serving as resultant openings for forming desired contact/via holes in the target layer, and the resist layer having the resultant openings comprising a resist pattern,
    wherein the at least one slit is formed in such a way that a volume of the resist layer material in a region of an original opening is approximately uniform for all of the original openings in the region.

2. The method according to claim 1, wherein a distance from an edge of said substrate to said slit is approximately the same as a pitch of said original openings.

3. The method according to claim 2, wherein in the reflowing the resist layer, the patterned resist layer is reflowed at a temperature higher than a softening temperature of a material of the resist layer by 10° C. or more and not exceeding 150° C.

4. The method according to claim 1, wherein the at least one slit is located between an edge of the resist layer and the at least one of the original openings adjacent to the edge.

5. The method according to claim 4, wherein the at least one slit is formed in such a way that deformation of a material of the resist layer in a peripheral area of the target layer is approximately equal to deformation of the material in an internal area of the target layer.

6. The method according to claim 1, wherein first to n-th sets of the original openings are located at first to n-th densities in first to n-th regions of the resist layer, respectively, where n is an integer greater than unity;
at least two of the first to n-th densities being different from each other;
the at least one slit being formed to surround each of the first to n-th regions of the resist layer.

7. The method according to claim 6, wherein the at least one slit is formed in such a way that a volume of the resist layer material in an n-th region of an original opening in said n-th region is approximately uniform for all of the original openings in the n-th region.

8. The method according to claim 1, wherein said specific width is selected so as to uniformize a deformation of said original opening.

9. The method according to claim 1, wherein said specific width is selected so as to uniformize the dimensions of said resultant openings.

10. The method according to claim 1, wherein the resist layer is made of a positive photoresist material.

11. The method according to claim 10, wherein the positive photoresist material contains a quinone-azide-system photosensitive agent, an alkali-soluble resin, and a solvent.

12. The method according to claim 1, wherein in the reflowing the resist layer, the patterned resist layer is reflowed at a temperature higher than a softening temperature of a material of the resist layer by 10° C. or more and not exceeding 150° C.

13. The method according to claim 1, wherein the original openings have a circular shape.

14. The method according to claim 1, wherein a width of said slit is approximately the same as a limit of resolution of an optical exposing apparatus used in making said resist pattern.

15. A method of making a resist pattern, comprising:
forming a resist layer on a target layer;
patterning the resist layer to form original openings in the resist layer; and
reflowing the resist layer under heat to cause deformation in the original openings, thereby contracting the original openings, the original openings thus contracted serving as resultant openings for forming desired contact/via holes in the target layer, and the resist layer having the resultant openings comprising a resist pattern,
wherein at least one slit is formed in the resist layer in said patterning the resist layer in such a way that the at least one slit surrounds at least one of the original openings and has a specific width, and
wherein the specific width is selected so as to uniformize a deformation of the original openings so as to cause the at least one slit to be eliminated by said reflowing.

16. The method of claim 15, wherein said resist layer comprises multiple regions with multiple densities of the original openings.

17. The method of claim 15, wherein a diameter of the resultant openings is substantially uniform.

18. A method of making a resist pattern, comprising:
forming a resist layer on a target layer;
patterning the resist layer to form original openings in the resist layer; and
reflowing the patterned resist layer under heat to contract the original openings,
wherein at least one slit is formed in the resist layer in said patterning the resist layer in such a way that the at least one slit surrounds at least one of the original openings and has a specific width,
wherein said resist layer comprises multiple regions with multiple densities of the original openings, and
wherein deformation is caused in the at least one slit in said reflowing the resist layer, eliminating the at least one slit.

19. The method of claim 18, further comprising:
wherein said reflowing contracts the original openings uniformly, and
wherein the original openings thus contracted serving as resultant openings for forming desired contacts or via holes in the target layer, the resist layer having the resultant openings comprising a resist pattern.

* * * * *